United States Patent
Arnold et al.

(10) Patent No.: US 6,747,618 B2
(45) Date of Patent: Jun. 8, 2004

(54) COLOR ORGANIC LIGHT EMITTING DIODE DISPLAY WITH IMPROVED LIFETIME

(75) Inventors: Andrew D. Arnold, Hilton, NY (US); Michael E. Miller, Rochester, NY (US); Michael J. Murdoch, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 4 days.

(21) Appl. No.: 10/224,239

(22) Filed: Aug. 20, 2002

(65) Prior Publication Data

US 2004/0036421 A1 Feb. 26, 2004

(51) Int. Cl.[7] .............................. G09G 3/30; G09G 3/10; H01J 1/62
(52) U.S. Cl. ....................... 345/77; 345/76; 313/504; 313/500; 315/169.3; 315/169.4
(58) Field of Search ............................. 345/77, 76, 60, 345/55; 313/504, 500, 498, 499, 506, 505, 503; 315/169.3, 169.4, 169.1

(56) References Cited

U.S. PATENT DOCUMENTS 5,917,280 A * 6/1999 Burrows et al. ............ 313/506
6,232,714 B1 * 5/2001 Shen et al. .................. 313/506
6,337,492 B1 * 1/2002 Jones et al. .................... 257/40
6,366,025 B1    4/2002 Yamada .................... 315/169.3
6,579,629 B1 * 6/2003 Raychaudhuri et al. ..... 428/690

OTHER PUBLICATIONS

US patent application Publication: 2002/0014837 A1, published Feb. 7, 2002, Kim et al.,.

USSN: 10/077,270, filed Feb. 15, 2002 by Liao et al.

US patent application Publication: 2003/0052597 A1, by Sakurai, published Mar. 20, 2003.

* cited by examiner

Primary Examiner—Tuyet T. Vo
(74) Attorney, Agent, or Firm—Thomas H. Close; Andrew J. Anderson

(57) ABSTRACT

An improved OLED color display device, in which a display pixel has a plurality of subpixels of different colors, wherein the areas of the subpixels are different in size based on the emission efficiency of the emissive elements and the chromaticity of a target display white point, thereby protecting the subpixels whose emission efficiency is low from prematurely deteriorating, wherein the improvement comprises the relative sizes of the subpixels being further based on the relative luminance stability over time of the subpixels, thereby further extending the useful lifetime of the display.

36 Claims, 9 Drawing Sheets

COLOR ORGANIC LIGHT EMITTING DIODE DISPLAY WITH IMPROVED LIFETIME

FIELD OF THE INVENTION

The present invention relates to a color organic light emitting diode (OLED) display having improved lifetime and to a method of designing such a display.

BACKGROUND OF THE INVENTION

Recent advances in flat panel display technology have included the advent of flat panel displays that are constructed using Organic Light Emitting Diodes. This flat panel display technology has many advantages over flat panel displays based on more popular liquid crystal display technology. Unlike liquid crystal displays that use the orientation of liquid crystal materials to modulate light from a large uniform backlight, OLED displays utilize materials that emit light. A full-color display is typically constructed by depositing three different materials that each emits a different color of light onto a substrate to create a full-color display, although they may also be constructed using a single emissive material and a color filter array. Depositing these separate light emissive elements in different spatial locations allows the construction of a full-color display when the light from the three primary colors are integrated by the human eye to allow the perception of a large gamut of colors from these few primary colors. During this deposition, equal areas of each of the three primary colors are commonly deposited onto the substrate.

Unfortunately, when equal area subpixels are used to construct a display using the OLED materials available today, the lifetime of the display is often limited by the lifetime of one of the OLED materials, typically blue. That is, when placed into a practical multicolor display, the time required for typical blue materials to deteriorate to produce half their original luminance is often only a fraction of the time required for typical green or red materials to deteriorate to the point that they produce half of their original luminance. For example, with one commonly available set of materials, the lifetime of the red emitting subpixels may be about 5.5 times as long as the lifetime of the blue emitting subpixels, and the lifetime of the green light emitting subpixels may be about 7 times as long as the lifetime of the blue light emitting subpixels, when each material set is driven at currents required to produce a standard color temperature display.

To maintain a well-balanced, full color display, it is important that the relative luminance of the three-colored materials be maintained throughout the lifetime of the display. If these relative luminance values change dramatically, images may have a serious color imbalance, and the user is likely to become dissatisfied with the display and consider the display to be at the end of its life. Some compensation can be made for the drop in blue efficiency over time by continually increasing the current density through the blue subpixels. However, it is known that increasing current densities tends to accelerate the luminance decay. Thus, the problem is actually worsened and the lifetime of the device before failure is shortened even more. Alternatively, one may reduce the luminance of the red and green to balance the blue, but this lowers the overall brightness of the display. Once the display becomes too dim, the user may also consider the display to be at the end of its useful lifetime, regardless of the relative luminance of the three colors. To maximize the useful lifetime of the display, it is important to maximize the time that the relative luminance of the three-color elements can be maintained while minimizing the loss of absolute luminance.

Flat panel displays with unequal areas of light emitting material have been discussed by Kim et al. in U.S. Patent Application 2002/0014837, published Feb. 7, 2002. Kim et al. discuss an OLED display in which the relative size of the red, green, and blue light emitting elements are adjusted based on the luminous efficiency of the color materials employed in an OLED display. It is commonly known that the available red OLED materials have significantly lower luminous efficiency than the existing green and blue OLED materials. Because of the lower efficiency of existing red OLED materials, if one wishes to maintain sub-pixels of equal size, the power per square area that must be provided to the low luminous efficiency material must be increased to obtain the desired light output. Using this criterion, Kim proposes an OLED display with twice as much red light emitting area as green and blue light emitting area. By creating displays with relatively larger areas of red emitting materials than green or blue materials, the relative power per square area can be somewhat equalized across the different colored materials. However, optimizing the display layout suggested by Kim et al., does not necessarily lead one to a design in which the lifetimes of the three materials are optimized.

U.S. Pat. No. 6,366,025 issued Apr. 2, 2002 to Yamada discloses an OLED display with unequal light emitting element areas, wherein the area of the light emitting elements are adjusted with the goal of improving the lifetime of the OLED display. Yamada considers the emission efficiency of the material, the chromaticity of each of the emissive materials and the chromaticity of the target display when attempting to determine the aim light emissive element areas. However, Yamada fails to discuss other important characteristics of OLED materials that will affect device lifetime, such as the differences in the inherent luminance stability over time of different materials. Yamada further does not consider important optical characteristics of the target display design, each of which will influence the overall lifetime of OLED materials.

There is a need therefore for an improved arrangement of the light emitting elements in an OLED display that compensates for the differences in the relative efficiencies and relative luminance stability over time of the different color emitting materials that are used to construct the display, thereby providing a display with a truly longer lifetime.

SUMMARY OF THE INVENTION

The need is met according to the present invention by providing an OLED color display device, in which a display pixel has a plurality of subpixels of different colors, wherein the areas of the subpixels are different in size based on the emission efficiency of the emissive elements, the chromaticity of a target display white point, and the relative luminance stability over time of the subpixels, thereby extending the useful lifetime of the display.

Advantages

The present invention has the advantage of extending the useful lifetime of full-color OLED displays by taking into account the differences in the relative efficiencies and luminance stability over time of the materials employed in the displays.

DETAILED DESCRIPTION OF THE INVENTION

The term "display device" is employed to designate a screen capable of electronically displaying video images or text. The term "pixel" is employed in its art-recognized usage to designate an element in a display device that can be addressed to form one part of a picture. The term "full color" is employed to describe multicolor display devices that are capable of forming color images. Generally red, green, and blue color primaries constitute the three primary colors from which all other colors can be generated by appropriately mixing these three primaries. It is recognized that a "full color" display may also be formed from more than three colors. The term "subpixel" is used in full color display devices and is employed to designate any portion of a pixel which can be independently addressable to emit a specific color. For example, a blue subpixel is that portion of a pixel which can be addressed to emit blue light. In a full-color display, a pixel generally comprises three primary-color subpixels, namely blue, green, and red. The term pixel or subpixel is generally used to designate the smallest addressable unit in a display device. Herein, the term light-emitting element is used interchangeably with the term subpixel.

The present invention is directed to a full color OLED display in which the relative areas of the primary color, light emitting elements (subpixels) are adjusted to improve the useful lifetime of the display device. This invention is achieved by adjusting the relative overall areas of each of the subpixels on the display while taking into account the relative luminance stability over time, in addition to other factors such as the luminance efficiencies of the light emitting materials that make up the elements (subpixels) of the display to optimize the useful lifetime of the display. In the context used here, useful lifetime of the display refers to the number of hours in which the display can satisfy requirements such as display luminance output and/or white point stability.

Figure 1:
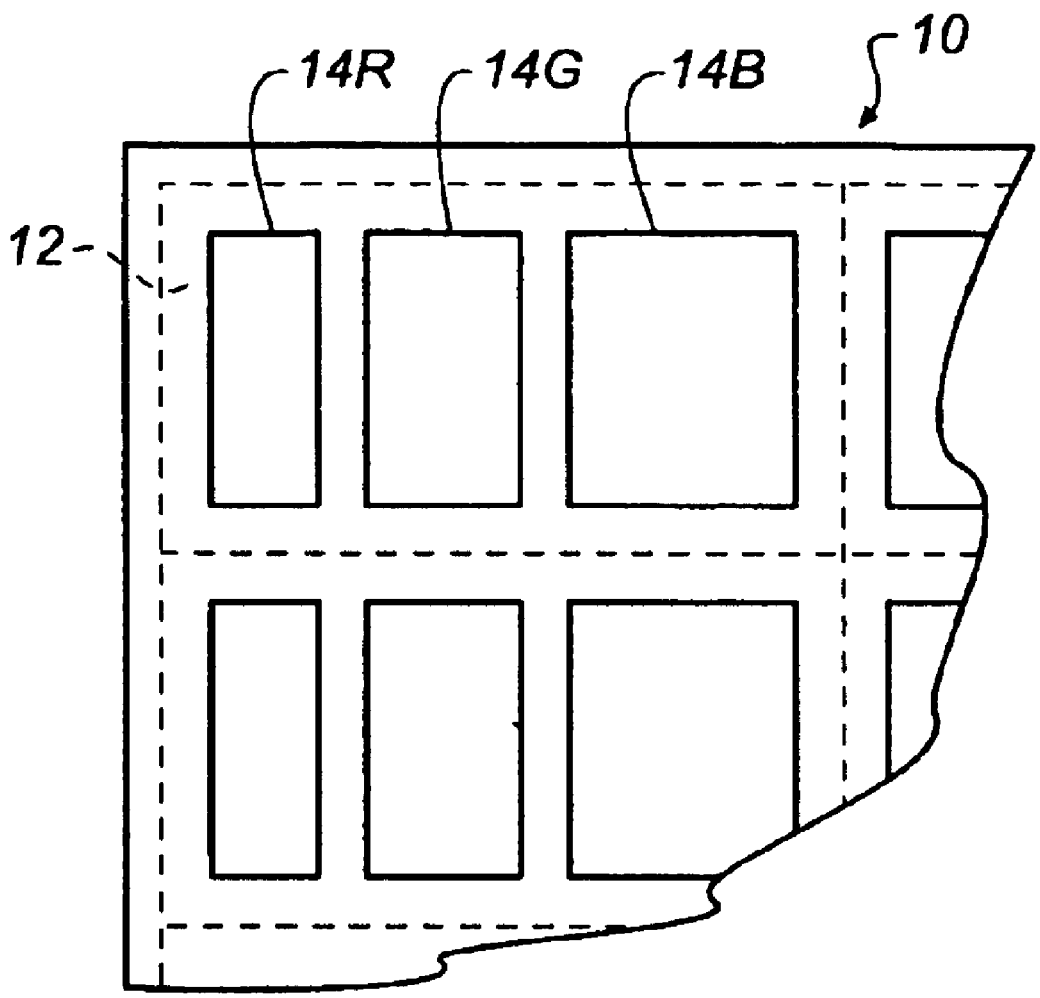
FIG. 1 is a schematic diagram showing a pixel having different sized subpixels as known in the prior art.

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT). For example, the structure described in U.S. Pat. No. 6,366,025 (which is incorporated herein by reference), may be employed to form an active matrix electroluminescent display device having subpixels with relative sizes determined according to the present invention. FIG. 1 is a schematic diagram that shows a portion of a full color OLED display device 10 having an array of pixels 12, each pixel 12 having subpixels 14 of different sizes as is known in the prior art. The subpixels 14 are labeled R, G, and B representing red, green and blue light emitting subpixels respectively.

Figure 2:
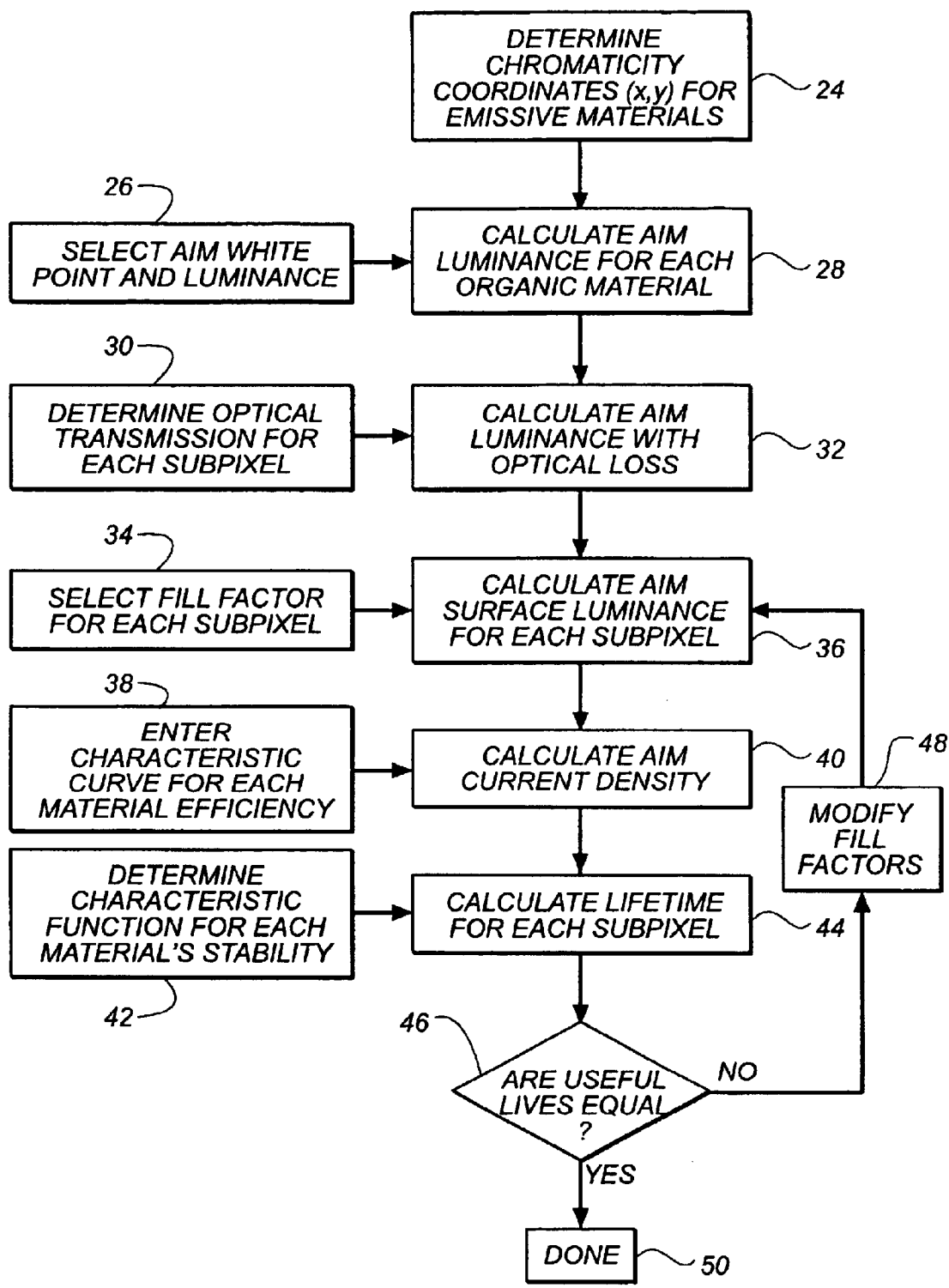
FIG. 2 is a flow chart of an iterative process used to determine relative subpixel areas according to the present invention.

Referring to FIG. 2, the relative sizes of the red, green, and blue subpixels in the display are determined according to one embodiment of the present invention by considering the chromaticity coordinates of the red, green and blue emissive subpixels; the aim white point and the luminance of the display; the fill factors of the red, green, and blue subpixels; the efficiency of the red, green, and blue subpixels; the optical transmission characteristics of the subpixels within the final display configuration; and the luminance stability over time of the red, green and blue emissive materials.

To calculate the relative sizes of the red, green and blue subpixels according to the present invention, the chromaticity coordinates for the red, green, and blue emissive materials are first determined 24. Next, the aim white point and luminance of the display device are selected 26. The aim luminance required from each light emissive element is then calculated 28 from these values. If the display device is characterized using an additive color system, these values can be calculated using the following equations:

$$Y_r = \frac{y_r(x_w(-y_b + y_g) + x_g(y_b - y_w) + x_b(-y_g + y_w))Y_w}{(x_g y_b - x_r y_b - x_b y_g + x_r y_g + x_b y_r - x_g y_r)y_w} \quad (1)$$

$$Y_g = \frac{y_g(x_w(y_b - y_r) + x_b(y_r - y_w) + x_r(-y_b + y_w))Y_w}{(x_g y_b - x_r y_b - x_b y_g + x_r y_g + x_b y_r - x_g y_r)y_w} \quad (2)$$

$$Y_b = \frac{y_b(x_w(-y_g + y_r) + x_r(y_g - y_w) + x_g(-y_r + y_w))Y_w}{(x_g y_b - x_r y_b - x_b y_g + x_r y_g + x_b y_r - x_g y_r)y_w} \quad (3)$$

where: $Y_w$ represents the luminance of the final display when the display is turned on to its maximum value; $X_w$ and $Y_w$ represent the chromaticity coordinates of the desired display white point; $Y_r$, $Y_g$, and $Y_b$ represent the luminance values that must be output from the display to create the selected aim white point and luminance when the red, green, or blue light emissive elements are all driven at their maximum value; $x_r$, $x_g$, and $X_b$ represent the respective x chromaticity coordinates of the red, green, and blue light emissive materials; and $Y_r$, $y_g$, and $y_b$ represent the respective y chromaticity coordinates of the red, green, and blue light emissive materials.

An optical transmission factor is then determined 30 for each light emissive element (subpixel) in the display device. This optical transmission factor indicates the proportion of the luminance of each light emissive element that will be emitted by the display. The optical transmission factor may include factors such as absorptions that take place within a polarizer or other layers within the display device structure and reflections that occur at the interface between different optical layers within the display device structure. The luminance values for each of the color light emissive elements are then calculated 32 by multiplying the previously calculated luminance values by the inverse of this proportion to determine the aim luminance for each light emissive element before unwanted absorptions.

A fill factor for each light emissive element is then selected 34. This fill factor is the proportion of the total pixel area that will emit light of the red, green, or blue light emissive elements. The necessary surface luminance value for each color light emissive element is then calculated 36 by multiplying the luminance value determined in 32 by the fill factor.

Characteristic curves relating output luminance to input current density (see FIG. 9) are then entered 38 for the light emissive materials employed in each subpixel. For most OLED materials, this characteristic curve will be a linear function that allows the current density to be calculated as a function of luminance. These functions may be of the form:

$$I=(L-b)/a, \quad (4)$$

where: I represents the current density required to drive each subpixel; L represents the surface luminance that was previously calculated; and a and b are constants that differ for each light emissive material. These functions are then used to calculate 40 the aim current density required to drive each subpixel to display the selected aim white point and luminance.

Characteristic curves relating current density to the luminance stability over time of the light emitting materials (see FIG. 10) are then determined 42 for the materials employed in each subpixel. For example, a power function of the form:

$$T=cI^d \quad (5)$$

may be used to estimate the time until the light-emitting element has lost half its original luminance where T is the time and c and d are constants that are different for each different material. These characteristic curves are determined empirically by measuring the light output from test pixels that are produced using the processes that will be employed to manufacture the display device. These characteristic functions may then be used to calculate 44 the useful lifetime of the subpixel within the display device. Once these useful lifetime values are calculated for all three light emissive elements, a decision 46 is made based upon whether the useful lives are substantially equal (within a predetermined tolerance) for the three subpixels. If the useful lives are not equal, the fill factors for the three light emissive elements are modified 48, reducing the area of the light emissive elements with the larger useful lives and increasing the area of the light emissive elements with the smaller useful lives. The calculations 36, 40, and 44 are performed again with the altered light emissive element areas. If the values are equal to one another, the process is complete 50 and the aim fill factor for the display is used to determine the final relative subpixel sizes.

Figure 3:
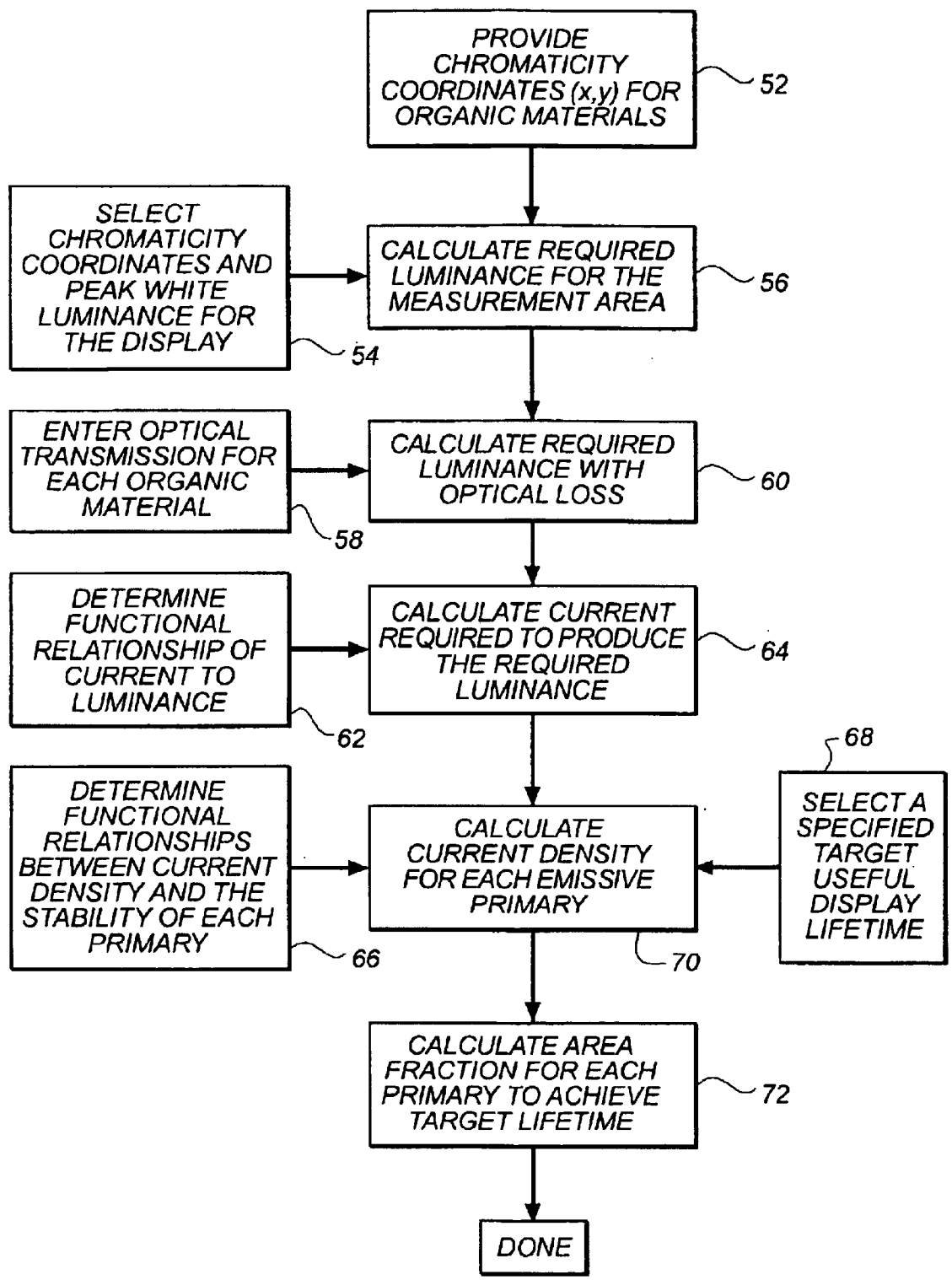
FIG. 3 is a flow chart of an alternative process used to determine relative subpixel areas according to the present invention.

Referring to FIG. 3, according to an alternative embodiment of the present invention, the relative areas of the light emissive elements may be calculated directly for a display by specifying a target useful lifetime for the display. Assuming that the luminance of an OLED display device is linear with current, i.e., the luminance measured over area $A_m$ doubles when the current applied to it doubles, one can calculate the relative subpixel sizes. This calculation may be performed by first providing 52 chromaticity coordinates for the light emissive elements. Then by selecting 54 the aim chromaticity coordinates and luminance of a target display white point, one calculates 56 the required luminance for the measurement area $A_m$ for each light emissive element using the chromaticity coordinates of the light emissive materials used for the subpixels, the aim white point and luminance of the target display using equations 1, 2, and 3.

An aim optical transmission factor for each emissive primary is then selected 58 and the required luminance is calculated 60 by dividing the luminance by an optical transmission factor. One can then determine 62 a functional relationship between the current supplied to measurement area $A_m$ of the material of a uniform test cell produced using the processes that will be employed to manufacture the display device and the luminance measured over $A_m$ of this same test cell for each of the emissive primaries.

Using this functional relationship, the required current per area $A_m$ is calculated 64 for each emissive primary to produce the required luminance. One can then determine 66 a functional relationship between current density and the luminance stability over time of each light-emitting element by illuminating several test cells using different current densities and measuring the luminance decay of the element over time. Having these relationships, a target useful lifetime is specified 68. The functional relationship between current density and luminance stability over time of the light-emitting element is used to calculate 70 the current density that will produce the selected useful lifetime for each emissive primary. Finally, an area fraction is calculated 72 for each emissive primary by dividing the required current per area $A_m$ by the respective calculated current densities. One skilled in the art will note that the sum of area fractions for the emissive elements may be greater than can be physically produced (e.g. greater than a display fill factor that is determined by the manufacturing process used to make the display), indicating that it is impossible to build a single layer display that meets the target useful lifetime using the materials that are characterized for this computation.

Figure 4:
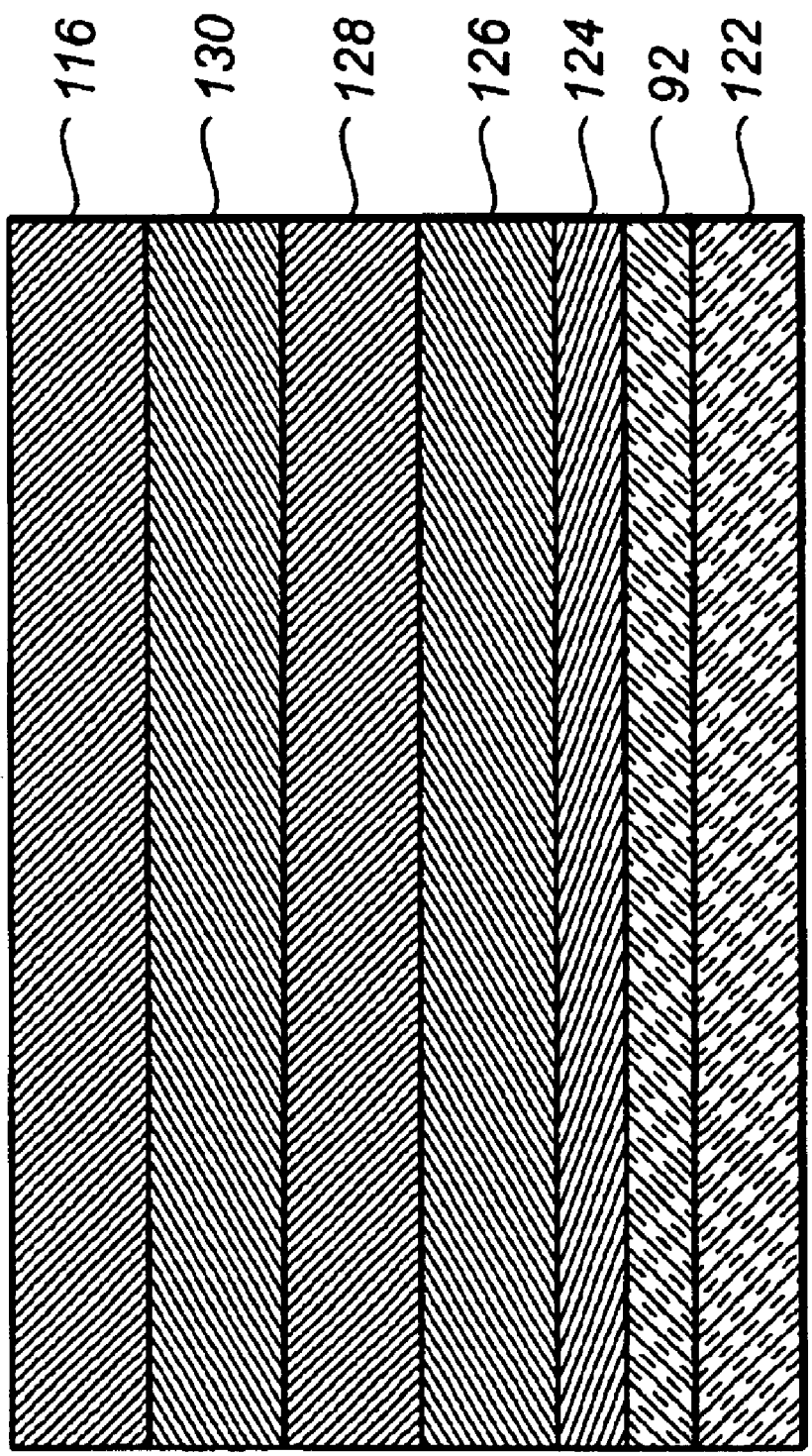
FIG. 4 is schematic cross-sectional diagram of a typical prior art organic light emitting display structure.

There are numerous configurations of the organic layers wherein the present invention can be successfully practiced. A typical prior art structure is shown in FIG. 4 and is comprised of a substrate 122, an anode layer 92, a hole-injecting layer 124, a hole-transporting layer 126, a light-emitting layer 128, an electron-transporting layer 130, and a cathode layer 116. These layers are described in detail below. Note that the substrate may alternatively be located adjacent to the cathode, or the substrate may actually constitute the anode or cathode. The organic layers between the anode and cathode are conveniently referred to as the organic EL element. The total combined thickness of the organic layers is preferably less than 500 nm.

The OLED device of this invention is typically provided over a supporting substrate 122 where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course it is necessary to provide in these device configurations a light-transparent top electrode.

When EL emission is viewed through anode 92, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

It is often useful to provide a hole-injecting layer 124 between anode 122 and hole-transporting layer 126. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1 029 909 A1.

The hole-transporting layer 126 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoaryl amine, diarylamine, triarylamine, or a polymeric aryl amine. Exemplary monomeric triarylamines are illustrated by Klupfel et al. in U.S. Pat. No. 3,180,730. Other suitable triarylamines substituted with one or more vinyl radicals and/or comprising at least one active hydrogen containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds.

Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

As more fully described in U.S. Pat. Nos. 4,769,292 and 5,935,721, the light-emitting layer (LEL) 128 of the organic EL element includes a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,769,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine[alias, tris(8-quinolinolato) aluminum(III)]

CO-2: Magnesium bisoxine[alias, bis(8-quinolinolato) magnesium(II)]

CO-3: Bis[benzo{f}-8-quinolinolato]zinc (II)

CO-4: Bis(2-methyl-8-quinolinolato)aluminum(III)-$\mu$-oxo-bis(2-methyl-8-quinolinolato) aluminum(III)

CO-5: Indium trisoxine[alias, tris(8-quinolinolato) indium]

CO-6: Aluminum tris(5-methyloxine)[alias, tris(5-methyl-8-quinolinolato) aluminum(III)]

CO-7: Lithium oxine [alias, (8-quinolinolato)lithium(I)]

CO-8: Gallium oxine[alias, tris(8-quinolinolato)gallium (III)]

CO-9: Zirconium oxine[alias, tetra(8-quinolinolato) zirconium(IV)]

Other classes of useful host materials include, but are not limited to: derivatives of anthracene, such as 9,10-di-(2-naphthyl)anthracene and derivatives thereof, distyrylarylene derivatives as described in U.S. Pat. No. 5,121,029, and benzazole derivatives, for example, 2, 2', 2"-(1,3,5-phenylene)tris[1-phenyl-1H-benzimidazole].

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives and carbostyryl compounds.

Electron-Transporting Layer (ETL)

Preferred thin film-forming materials for use in forming the electron-transporting layer 130 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

In some instances, layers 130 and 128 can optionally be collapsed into a single layer that serves the function of supporting both light emission and electron transport. These layers can be collapsed in both small molecule OLED systems and in polymeric OLED systems. For example, in polymeric systems, it is common to employ a hole-transporting layer such as PEDOT-PSS with a polymeric light-emitting layer such as PPV. In this system, PPV serves the function of supporting both light emission and electron transport.

When light emission is viewed solely through the anode, the cathode 116 used in this invention can be comprised of nearly any conductive material. Desirable materials have good film-forming properties to ensure good contact with the underlying organic layer, promote electron injection at low voltage, and have good luminance stability over time. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL), which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608, 287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, and U.S. Pat. No. 6,278,236. Cathode materials are typically deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,851,709 and 6,066,357) and inkjet method (U.S. Pat. No. 6,066,357).

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

In addition to the device architecture described above, each organic EL element may be comprised of a series of organic stacks as described in copending U.S. patent application Ser. No. 10/077,270, which is incorporated herein by reference.

While this implementation has been described with respect to an OLED display constructed of different red, green, and blue light emitting materials, one skilled in the art will recognize that this same display configuration and process can be applied to the construction of an OLED display employing color filters. However, when employing color filters, the chromaticity coordinates of each color light emitting element and the luminance of each color of light emitting material as it contributes to the overall display luminance and chromaticity must be calculated by determining the spectral radiance of the light emitting materials across the visible spectrum, multiplying these spectra by the transmission of each of the color filter elements at each wavelength, and transforming the resulting spectral values to standardized luminance and chromaticity coordinates using standard CIE conventions.

Figure 5:
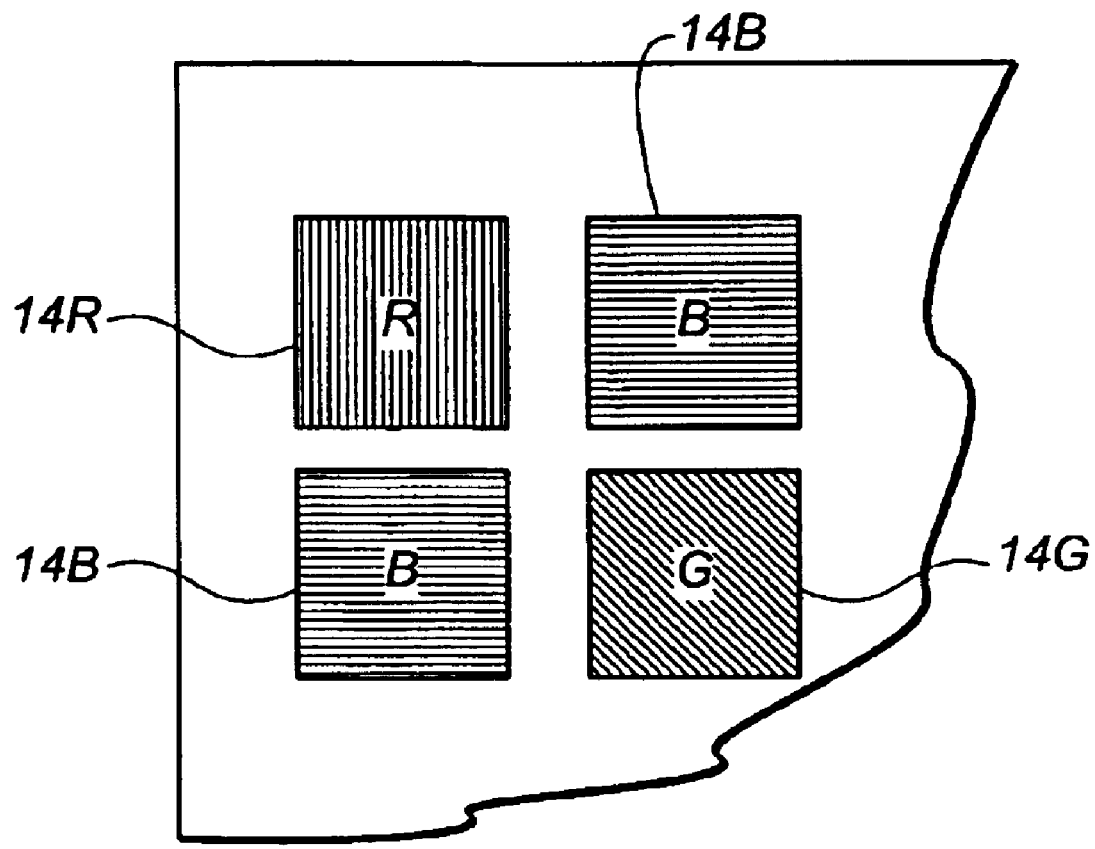
FIG. 5 is a schematic top view of a display pixel in an OLED display apparatus according to an embodiment of the present invention in which the largest subpixel is divided into more than one light emitting region.

According to an alternative embodiment of the present invention subpixels may be further divided into spatially distinct regions. Such an embodiment is shown in FIG. 5 where the subpixel with the largest area (for example the blue subpixel 14B) is divided into two regions. In this example, the red subpixel 14R and green subpixel 14G are each composed of a single region. In this embodiment, the spatial pattern of the array of blue subpixels becomes visually less noticeable when viewing the display from a normal viewing distance, thereby improving the perceived quality of the display while providing improved lifetime according to the present invention.

Figure 6:
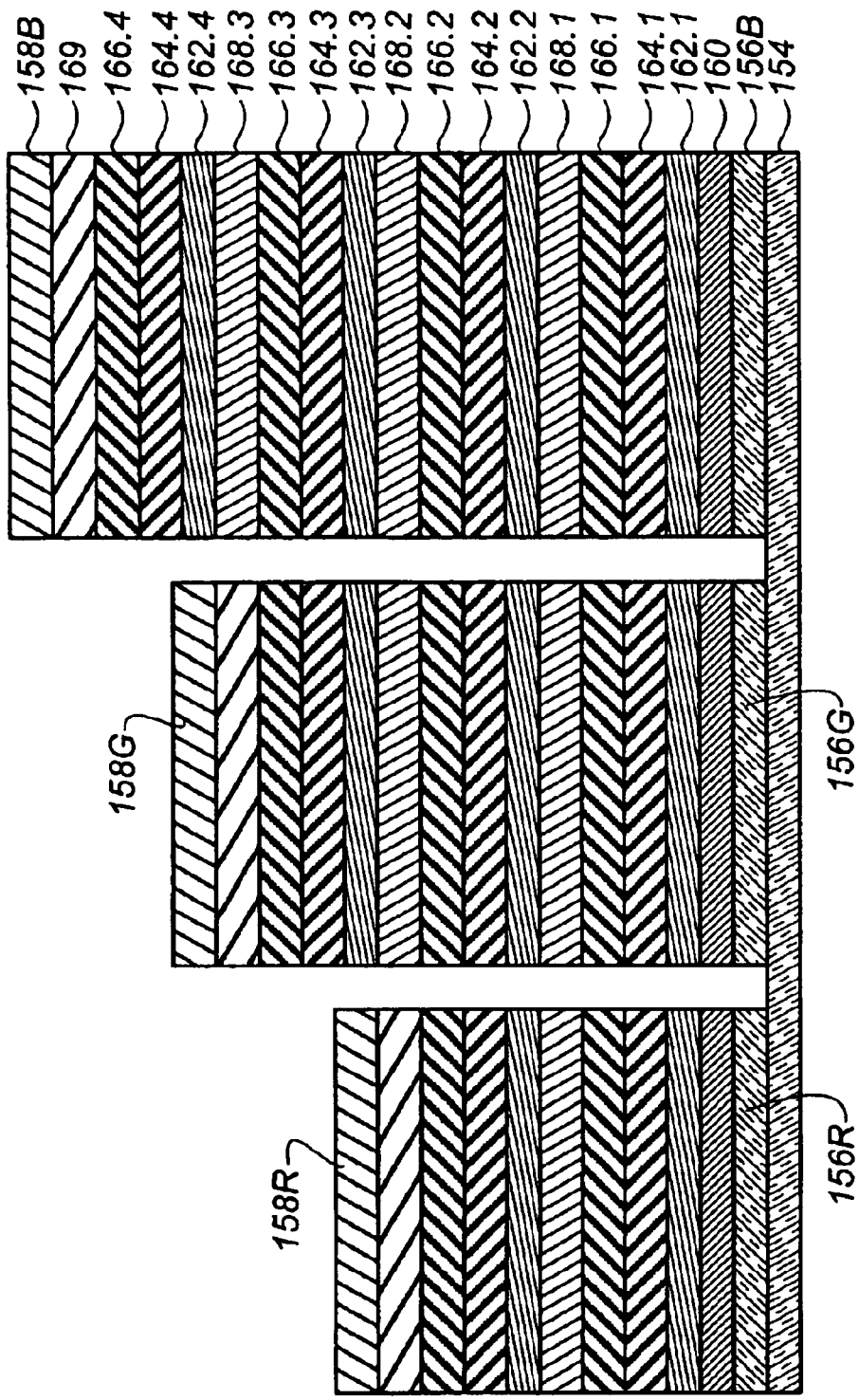
FIG. 6 is a schematic illustration of an organic light emitting display structure according to the present invention in which the number of multiple stacked layers and the sizes of the subpixels are selected to optimize the lifetime of the final display.

Referring to FIG. 6, according to a further embodiment of the present invention the relative areas of the subpixels are achieved by stacking multiple hole transport, light emitting and electron transport layers between the anode and cathode as described in U.S. patent application Ser. No. 10/077,270. In other words, providing two stacks of blue light-emitting units effectively doubles the area of the blue subpixel. According to this embodiment, unequal numbers of light-emitting layers may be deposited for different subpixels, and may be further combined with unequal areas to achieve the relative subpixel areas calculated according to the present invention.

As shown in FIG. 6, multiple layers are deposited on a substrate 154 between the anode 156 and cathode 158. In the preferred embodiment, a hole-injecting layer 160 will be deposited on the anode 156 followed by a hole transport layer 162.1, a light emitting layer 164.1, and an electron transport layer 166.1. Next, a doped organic connector 168.1 is deposited. The doped organic connector 168.1 may be any material that provides efficient electron and hole injection into the adjacent organic light emitting units. Materials of this type are described in detail in U.S. patent application Ser. No. 10/077,270.

Over the doped organic connector 168.1, another hole transport layer 162.2, light emitting layer 164.2 and electron transport layer 166.2 is deposited. As many stacks (light emitting units) as required to achieve the desired lifetime characteristics may be fabricated by supplying muliple layers of doped organic connectors 168.1, 2 and 3, hole transport layers 162.1, 2, 3, and 4, light emitting layers 164.1, 2, 3 and 4, and electron transport layers 166.1, 2, 3 and 4 as illustrated for the blue subpixel in FIG. 6. FIG. 6, shows a device with a two unit stack for the red light emitting elements, a three unit stack for the green light emitting elements, and a four unit stack for the blue light emitting elements. After the appropriate number of stacked units are deposited, an electron injecting layer 169 is deposited on the entire stack, followed by the cathode 158.

The order in size of the areas of the green, red, and blue emission regions and the number of layers of green, red, and blue emission regions are determined according to the method of the present invention described above. However, within this embodiment, if it is determined that the lifetime of the three light emitting elements are not equal, the relative sizes and/or the number of layers for the three subpixels are modified 48, reducing the area of the materials with the larger values and increasing the area of the materials with the smaller values. It is also recognized that the optical transfer characteristics of each layer in the stack may be somewhat different and is to be taken into account when determining the relative areas.

Figure 7:
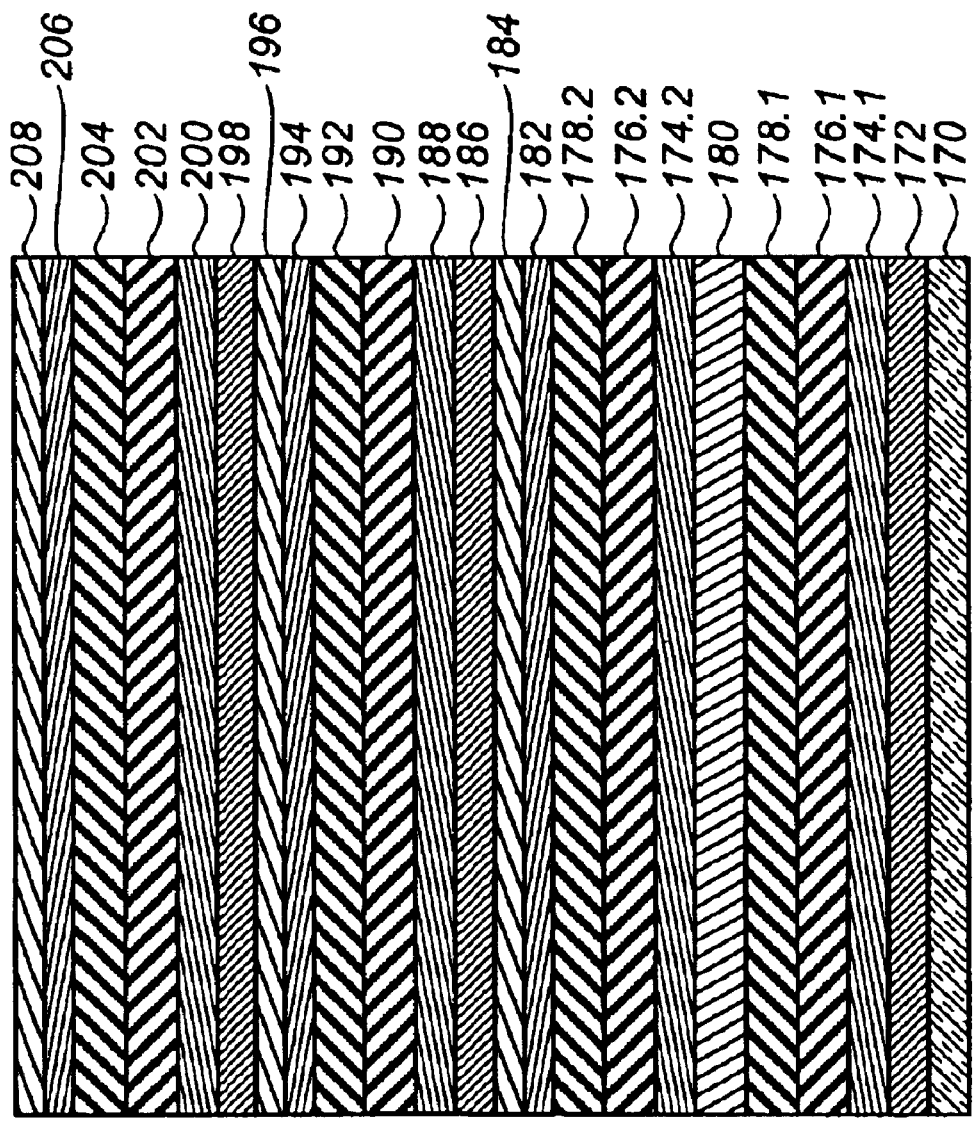
FIG. 7 is a schematic diagram of an organic light emitting display structure according to the present invention in which the different colored layers are stacked on top of each other and the number of layers of each color are selected to optimize the lifetime of the final display.

According to a still further embodiment of the present invention a larger area for the light emitting material is provided within an RGB stacked OLED display of the type described in U.S. Pat. No. 6,358,63 1. Herein, each subpixel in the stack is comprised of multiple light emitting units of substantially the same color as described in pending U.S. patent application Ser. No. 10/077,270. This increases the overall area of the light emitting material and reduces the current density per unit area. An embodiment is depicted in FIG. 7. This figure depicts a stacked OLED display as described in U.S. Pat. No. 6,358,631 (which is incorporated herein by reference) in which one of the light emitting layers is actually composed of two layers as described in patent application Ser. No. 10/077,270.

In the embodiment shown in FIG. 7, the differently colored subpixels are stacked on top of each other and include an anode 170 on which a hole injecting layer 172 is deposited. A hole transport layer 174.1, light emitting layer 176.1, and an electron transport layer 178.1 are then deposited onto this hole injecting layer 172. A doped organic connector 180 is then deposited followed by a hole transport layer 174.2, light emitting layer 176.2 and an electron transport layer 178.2. An optional electron ejecting layer (not shown) may then be deposited. The cathode is then created through the deposition of a metallic layer 182 and an ITO layer 184. Within this embodiment, the elements with numbers 172 through 184 compose a single addressable pixel element of a single color.

A second colored subpixel is then formed through the deposition of a hole injecting layer 186, a hole transport layer 188, a light emitting layer 190, an electron transport layer 192, an optional electron injection layer (not shown), a metallic layer 194 and an ITO layer 196. Finally, a third colored subpixel is formed through the deposition of a hole injecting layer 198, a hole transport layer 200, a light emitting layer 202, an electron transport layer 204, an optional electron injection layer (not shown), a metallic layer 206 and an ITO layer 208.

The order of the areas of the green, red, and blue emission regions G, R, and B and the number of layers of green, red, and blue emission regions are determined based on the processes described above with reference to FIG. 2 or 3. The order of the subpixels in the stack needs to be taken into account because of the masking effects of the subpixels that may be positioned over a given subpixel. However, within this embodiment if it is determined that the lifetime of the three light emitting elements are not equal, the number of layers or the stacking order for the three subpixels are modified 48, increasing the area of the materials with the smaller values and potentially reducing the area of the materials with the larger values.

Figure 8:
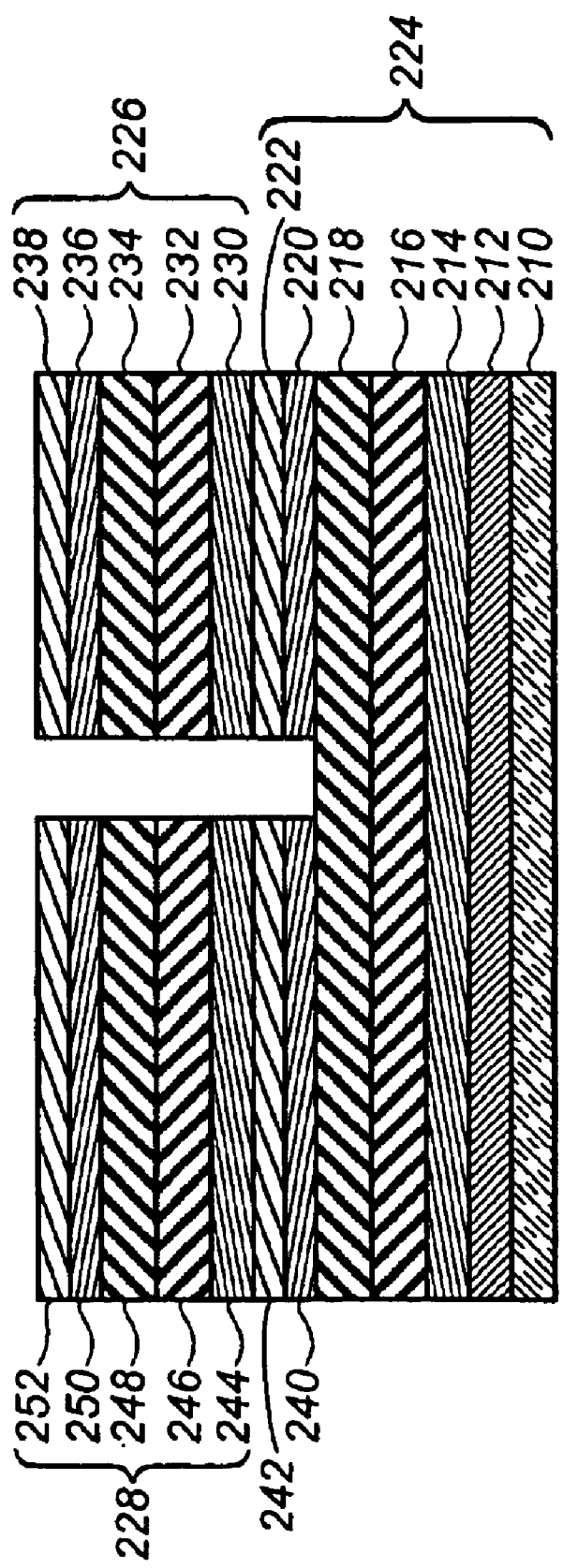
FIG. 8 is a schematic diagram of an organic light emitting display structure according to the present invention in which one subpixel is provided on a first layer and second and third subpixels are provided on a second layer and the relative sizes of the subpixels are selected to optimize the lifetime of the final display.

Referring to FIG. 8, according to a still further embodiment of the present invention a larger area for the light emitting element with the shortest lifetime is provided within a stacked OLED display. In this embodiment, two subpixels (e.g. red and green) are stacked on top of a third subpixel (e.g. blue). A first subpixel is formed from an anode 210 on which a hole injecting layer 212 is deposited. A hole transport layer 214, light emitting layer 216, and an electron transport layer 218 are then deposited onto this hole injecting layer 212. An optional electron ejecting layer (not shown) may then be deposited. The cathode is then created through the deposition of a metallic layer 220, 240 and an ITO layer 222, 242. The metallic layer 220, 240 and ITO layer 222, 242 also serve as an anode for the second and third subpixels. This first subpixel 224 provides the light for the shortest lifetime light emitting element (e.g. blue) and has substantially the same area as the combined areas of the second 226 and third 228 subpixels. This first subpixel may be composed of multiple areas that are treated as a single light emitting element or may be a single element as shown in FIG. 8. By separating the first subpixel into multiple areas, shorts or dark spots that are created in one half of the first subpixel can be precluded from growing into its neighboring areas.

A subpixel 226 is formed on top of this first subpixel 224. This second subpixel 226 is formed by depositing a hole transport layer 230, a light emitting layer 232 and an electron transport layer 234. An optional electron ejecting layer (not shown) may then be deposited. The cathode is then created through the deposition of a metallic layer 236 and an ITO layer 238.

A third subpixel 228 is also formed on top of the first subpixel 224. This third subpixel 228 is formed from a hole transport layer 244, a light emitting layer 246 and an electron transport layer 248. An optional electron ejecting layer (not shown) may then be deposited. The cathode is then created through the deposition of a metallic layer 250 and an ITO layer 252. It should also be noted that the relative areas of the second and third subpixels may not be equal depending on the relative areas calculated according to the present invention.

As stated before, the order in size of the areas of the first, second, and third subpixels are determined based on the process shown in FIG. 2 or 3 as described earlier. It should be recognized that this same embodiment may further be modified to contain multiple light emissive layers within the first, second, and/or third light emitting element as described above.

EXAMPLE 1 (INVENTIVE)

To further demonstrate the difference between the system and method described herein from the prior art, an example is provided. Within this example, it is assumed that the lifetime is defined as the number of hours required for any of the three color subpixels to decay to 50% of their original luminance. To utilize this method, it is important to establish the specific efficiencies and luminance stabilities over time of the materials from which the display is to be built as well as to establish the aim characteristics of a display.

Figure 9:
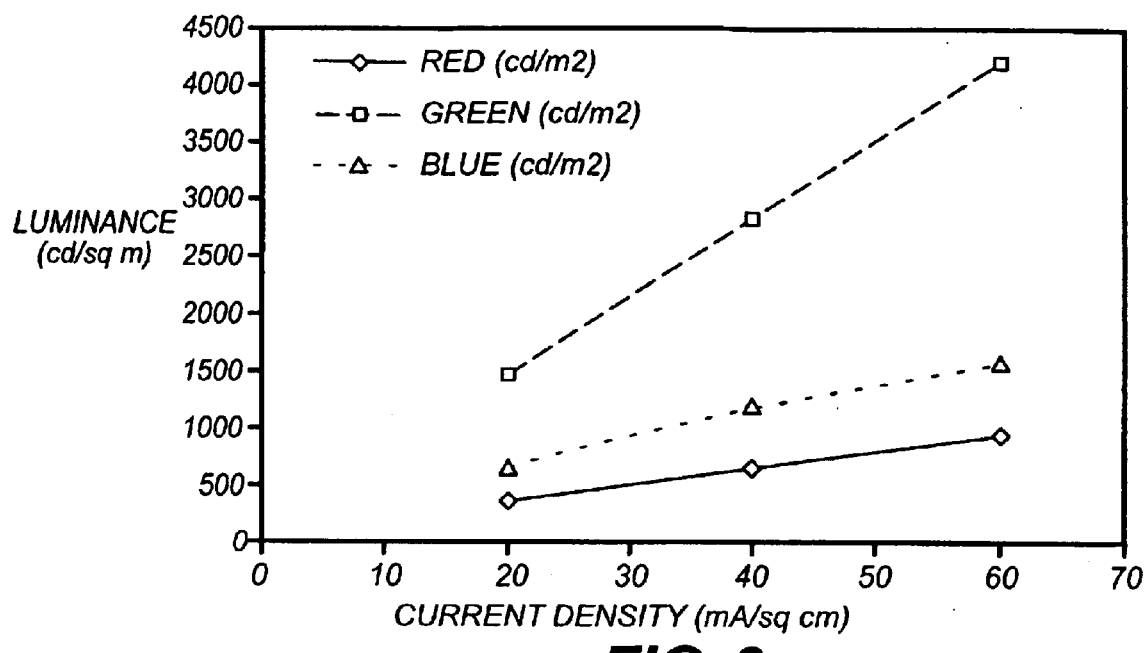
FIG. 9 is a graph useful in describing the present invention, showing the relationship between the luminance output and current density in OLED materials that emit red, green and blue light respectively.

In this example, it is assumed that a number of OLED test cells are available that have been prepared using the light emitting materials to be used in the display. These test cells are driven and configured as similarly to the final display as possible. The efficiencies and chromaticity coordinates for each test cell are determined by driving the test cell to a series of different current densities and measuring the luminance and chromaticity coordinate for each test cell. The average performance of these test cells are calculated from the measured data to determine the efficiency of the red, green, and blue light emitting elements. Equations are then fit to this data to determine the efficiency curve for each material. Sample data sets and linear fits for an example family of light emitting elements are shown in FIG. 9. The linear fits shown in this figure can be described using the slopes and offsets for material efficiencies shown in Table 1 below.

Figure 10:
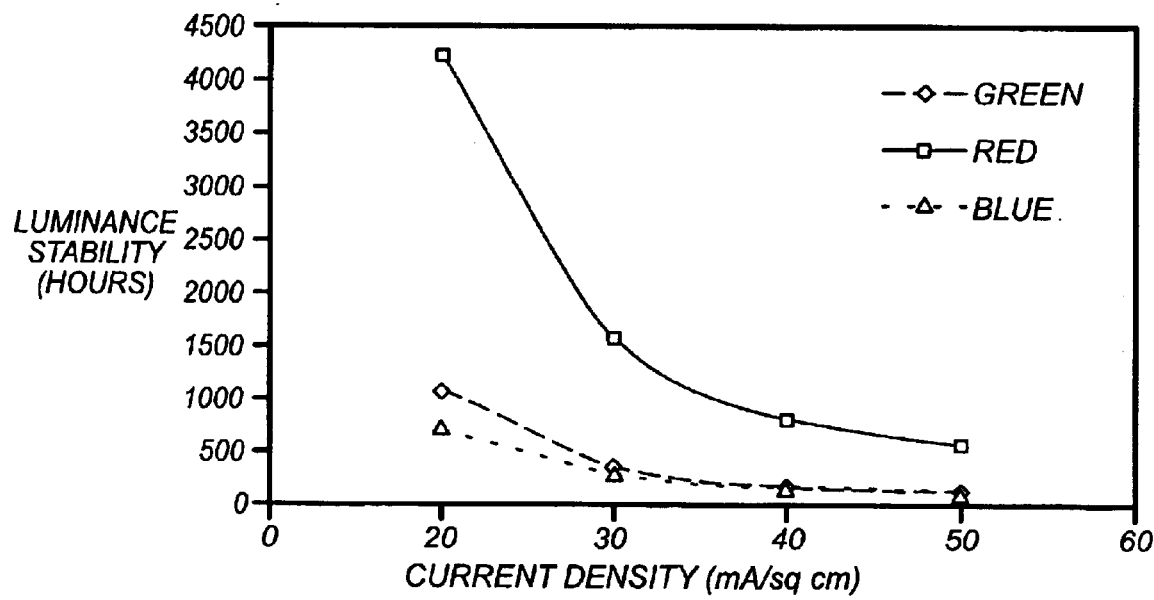
FIG. 10 is a graph useful in describing the present invention, showing the relationship between the material luminance stability over time and current density in OLED materials that emit red, green and blue light respectively.

The luminance stability over time of each light-emitting element may then be determined by selecting a subset of the test cells for each material and driving them with a single current density while measuring the luminance decay of the material over time. Once again, the average performance may be determined from a group of test cells that were prepared using the same light emissive materials and driven and configured as similarly to the final display as possible. A sample data set and power function fit to this data are shown in FIG. 10 for the same example family of light emitting materials. The multiplication and exponential factors for these equations that characterize luminance stability over time are shown in Table 1 below.

The remaining characteristics of the display and of the materials were likewise determined empirically. The remaining characteristics of the light emitting element are shown in Table 1 below. The display characteristics for this example are shown in Table 2 below.

Table 1 lists the important characteristics for the red, green, and blue light emitting elements to be used in constructing the final display. As shown in this table, the chromaticity coordinates, a characterization of the efficiency, luminance stability over time and optical transmission factor for each light-emitting element are included.

TABLE 1

| Characteristic | Red Light Emitting Material | Green Light Emitting Material | Blue Light Emitting Material |
|---|---|---|---|
| x chromaticity coordinate | 0.6492 | 0.3118 | 0.1478 |
| y chromaticity coordinate | 0.3474 | 0.6196 | 0.1909 |
| Slope for efficiency equation | 16.82 | 70.33 | 28.03 |

TABLE 1-continued

| Characteristic | Red Light Emitting Material | Green Light Emitting Material | Blue Light Emitting Material |
|---|---|---|---|
| Intercept for efficiency equation | 0.0 | 0.0 | 0.0 |
| Multiplication factor for the luminance stability equation | 348006 | 116540 | 37234 |
| Power for luminance stability equation | −1.4687 | −1.6650 | −1.3148 |
| Optical transmission factor | 0.5 | 0.5 | 0.5 |

Table 2 lists the luminance and chromaticity coordinates for the display. The aim fill factor (the proportion of the pixel area that will emit light in the final display) is also shown in Table 2.

TABLE 2

| Display Characteristic | Value |
|---|---|
| Luminance of 100% white | 100 cd/sq m |
| x chromaticity coordinate for white | 0.3128 |
| y chromaticity coordinate for white | 0.3292 |
| Fill factor | 0.60 |

Employing the data in Tables 1 and 2, and using the method of the present invention as described above, the relative proportions for the subpixels were calculated to be approximately, 0.125, 0.125, and 0.350 for the red, green, and blue light emitting elements respectively, where the total area of the pixel is 1. That is, the area ratio of red:green:blue light emitting elements is 1:1:2.8. In addition, the expected time for the red, green, and blue light emitting elements to produce half their initial luminance are 8285, 8203, and 8589 hours, respectively. This method provides a display lifetime of 8203 hours.

EXAMPLE 2 (COMPARATIVE)

Using a conventional display of the prior art, one third of the total available display fill factor would be allocated to the red, green, and blue light emitting element. Using this conventional approach and the characteristics of the display and materials as shown in Tables 1 and 2, 20 percent of the light emitting area of each pixel in the final display would emit red, green, and blue light. Using the data in these tables and the equations shown within this disclosure, the time required for the red, green, and blue light emitting elements to produce half their initial luminance under the current drive conditions would be 16523, 17941, and 4115 hours, respectively. Notice that within this prior art configuration, the lifetime of the display is 4115 hours when lifetime is defined as the time for any of the three color subpixels to decay to produce 50% of their initial luminance.

EXAMPLE 3 (COMPARATIVE)

In this example, the method of Yamada in U.S. Pat. No. 6,366,025 is used to determine the relative red, green, and blue areas. Yamada discusses the selection of individual light emitting element fill factors by determining the luminance ratios of the red, green and blue light emitting elements required to produce the desired white point. Then determining the emission efficiency ratio required to achieve a luminance of 1 and then dividing the luminance ratios by the maximum emission efficiency ratio.

Within this example, equations 1, 2 and 3 are used to calculate the required red, green and blue luminance values to obtain the luminance and chromaticity coordinates shown in Table 2. The values are normalized by dividing each value by the maximum of the three values. This calculation produces luminance ratios of R:G:B=0.62:1.0:0.69.

The emission efficiency is then calculated. For the material set described above, one can use the intercept and slope of the efficiency equation for each light emitting material to calculate the current density required to produce a luminance of 1. Performing these calculations, an emission efficiency ratio of R:G:B=16.8:70.33:29.93 is obtained. Dividing the luminance ratios by the emission efficiency ratios produces R:G:B=0.62/16.8:1.0/70.33:0.69/29.93= 0.0369:0.0142:0.0231. Normalizing these values to provide a green value of 1, the relative areas of the red, green, and blue light emitting elements is R:G:B=2.6:1.0:1.6, indicating that the red light emitting element should be 2.6 times the size of the green light emitting element, and the blue light emitting element should be 1.6 times the size of the green light emitting element.

The lifetime of a display with these pixel sizes may then be calculated using the method provided herein. Assuming that the total fill factor is constrained to 60 percent of the total pixel area and using the relative sizes calculated above, the fill factors to be used in this calculation are 0.3 for the red, 0.115 for the green and 0.185 for the blue subpixel. These results vary significantly from the relative areas calculated using the method of this invention. In this example, the time required for the three subpixels to produce half their initial luminance under the current drive conditions are 29972, 7140, and 3714 hours for the red, green, and blue subpixels, respectively. Notice that within this prior art configuration, the lifetime of the display is 3714 hours when lifetime is defined as the time for any of the three color subpixels to decay to produce 50% of their initial luminance.

EXAMPLE 4 (COMPARATIVE)

In this example, the method of Kim et al. is used to determine the relative sizes of each subpixel. Kim et al discusses the selection of individual subpixel sizes based upon the luminance efficiency of the materials. Using this approach, the relative sizes would be determined based upon the ratios of the current density required to produce a luminance of 1. The relative areas of the red, green, and blue light emitting elements is achieved by dividing the emission efficiency of the material with the highest efficiency by the emission efficiency of each light emitting material, which indicates that the red light emitting element should be 4.18 times the size of the blue light emitting element and 2.51 times the size of the green light emitting element. This would indicate relative fill factors of 0.32 for the red, 0.078 for the green and 0.19 for the blue light emitting element. As with Yamada, the method of Kim teaches a very different ratio of subpixel areas. The time required for the red, green, and blue subpixels to produce half their initial luminance under the current drive conditions is 32,952, 3741, and 3847 hours, respectively. Notice that within this prior art configuration, the lifetime of the display is 3741 hours when lifetime is defined as the time for any of the three color subpixels to decay to produce 50% of their initial luminance.

Thus it can be readily seen the method of the present invention provides a substantial improvement in the useful lifetime of the display over the methods described in the prior art.

The invention has been described in detail with particular reference to certain preferred embodiments thereof, but it will be understood that variations and modifications can be effected within the spirit and scope of the invention. One such variant could be the use of more than three colors.

PARTS LIST

| | |
|---|---|
| 10 | OLED display device |
| 12 | pixel |
| 14 | subpixel |
| 24 | determine step |
| 26 | select step |
| 28 | calculate step |
| 30 | determine step |
| 32 | calculate step |
| 34 | select step |
| 36 | calculate step |
| 38 | enter step |
| 40 | calculate step |
| 42 | determine step |
| 44 | calculate step |
| 46 | decision step |
| 48 | modify step |
| 50 | complete process step |
| 52 | provide step |
| 54 | select step |
| 56 | calculate step |
| 58 | select step |
| 60 | calculate step |
| 62 | determine step |
| 64 | calculate step |
| 66 | determine step |
| 68 | specify step |
| 70 | calculate step |
| 72 | calculate step |
| 92 | anode layer |
| 116 | cathode layer |
| 122 | substrate |
| 124 | hole-injecting layer |
| 126 | hole-transporting layer |
| 128 | light-emitting layer |
| 130 | electron-transporting layer |
| 154 | substrate |
| 156 | anode |
| 158 | cathode |
| 160 | hole-injecting layer |
| 162.1, 2, 3 and 4 | hole-transporting layer |
| 164.1, 2, 3 and 4 | light emitting layer |
| 166.1, 2, 3 and 4 | electron transporting layer |
| 168.1, 2 and 3 | organic connector |
| 169 | electron injecting layer |
| 170 | anode |
| 172 | hole-injecting layer |
| 174.1, 2 | hole-transporting layer |
| 176.1, 2 | light emitting layer |
| 178.1, 2 | electron transport layer |
| 180 | organic conductor |
| 182 | metallic layer |
| 184 | ITO layer |
| 186 | hole injecting layer |
| 188 | hole transport layer |
| 190 | light emitting layer |
| 192 | electron transport layer |
| 194 | metallic layer |
| 196 | ITO layer |
| 198 | hole injecting layer |
| 200 | hole transport layer |
| 202 | light emitting layer |
| 204 | electron transport layer |
| 206 | metallic layer |
| 208 | ITO layer |
| 210 | anode |
| 212 | hole injecting layer |
| 214 | hole transport layer |
| 216 | light emitting layer |
| 218 | electron transport layer |
| 220 | metallic layer |
| 222 | ITO layer |
| 224 | first subpixel |
| 226 | second subpixel |

-continued

PARTS LIST

| | |
|---|---|
| 228 | third subpixel |
| 230 | hole transport layer |
| 232 | light emitting layer |
| 234 | electron transport layer |
| 236 | metallic layer |
| 238 | ITO layer |
| 240 | metallic layer |
| 242 | ITO layer |
| 244 | hole transport layer |
| 246 | light emitting layer |
| 248 | electron transport layer |
| 250 | metallic layer |
| 252 | ITO layer |

What is claimed is:

1. An improved OLED color display device, in which a display pixel has a plurality of subpixels of different colors, wherein the areas of the subpixels are different in size based on the emission efficiency of the emissive elements and the chromaticity of a target display white point, thereby protecting the subpixels whose emission efficiency is low from prematurely deteriorating, wherein the improvement comprises:

the relative sizes of the subpixels being further based on the relative luminance stability over time of the subpixels, thereby further extending the useful lifetime of the display.

2. The color display device claimed in claim 1, wherein the relative sizes of the subpixels are determined according to the equation:

$$A_i = f(E_i, T_i, Y_i)$$

where $A_i$ are the sizes of the subpixels; $E_i$ are the material efficiencies for the differently colored subpixels; $T_i$ are the luminance stability over time for the differently colored subpixels; and $Y_i$ are the luminances of the differently colored subpixels for a given target display white and the chromaticity coordinates of the subpixels.

3. The color display device claimed in claim 2, wherein the luminance stability over time are defined as:

$$T_i = cI^d$$

where c and d are constants and I is the current density through the subpixel.

4. The color display device claimed in claim 1, wherein the differently colored subpixels emit red, green and blue light.

5. The color display device claimed in claim 1, wherein more than three colored subpixels are used to form the color display device.

6. The color display device claimed in claim 4, wherein the area of the blue subpixels is substantially larger than the area of the red and green subpixels to compensate for the relatively short lifetime of the blue subpixels.

7. The color display claimed in claim 1, wherein the subpixels are stacked on top of one another.

8. The color display claimed in claim 1, wherein layers of light emitting material of the same color are stacked on top of one another to form a subpixel having an effective area proportional to the number of layers.

9. The color display claimed in claim 1, wherein different numbers of different colored light emitting layers are stacked on top of one another to provide the different subpixel areas.

10. The color display claimed in claim 1, wherein the subpixels having the largest size are located on one plane, and subpixels having a plurality of different sizes are located on another plane.

11. The color display claimed in claim 10, wherein the subpixels emit red, green and blue light, the blue subpixels are located in the one plane and the red and green subpixels are located in the other plane.

12. The color display claimed in claim 1, wherein at least one of the subpixels is subdivided into visually distinct regions.

13. A method of determining the relative sizes of subpixels in a OLED display device of the type having a display pixel that includes a plurality of subpixels of different colors, wherein the subpixels are different in size based on the emission efficiency of the subpixels, the chromaticity of a target display white, and the relative luminance stability over time of the subpixels thereby protecting the subpixels whose emission efficiency is low from prematurely deteriorating, comprising the steps of:

a) measuring chromaticity coordinates for the subpixels;
b) selecting aim chromaticity coordinates and luminance of a target display white point;
c) calculating a required luminance for each subpixel using the chromaticity coordinates of the subpixels, and the aim chromaticity coordinates and the luminance of the target display white point;
d) selecting an initial light emissive area for each subpixel;
e) providing an optical transmission factor for each subpixel;
f) calculating an actual luminance for each subpixel using the initial areas and optical transmission factors for the subpixel;
g) determining a functional relationship between current density and luminance output for each subpixel;
h) calculating an aim current density for each subpixel;
i) determining a functional relationship between current density and a luminance stability over time for each subpixel;
j) calculating a lifetime for each subpixel using the aim current density and the luminance stability functions; and
k) if the lifetimes are unequal, modifying the light emissive areas of the subpixels and repeating steps h, j, and k until the lifetimes are substantially equal.

14. The method claimed in claim 13, wherein the relative sizes are determined according to the equation:

$$A_i = f(E_i, T_i, Y_i)$$

where $A_i$ are the areas of the subpixels; $E_i$ are the material efficiencies for the differently colored subpixels; $T_i$ are the luminance stabilities over time for the differently colored subpixels; and $Y_i$ are the luminances of the differently colored subpixels for a given target display white and the chromaticity coordinates of the subpixels.

15. The method claimed in claim 14, wherein the luminance stability for each of the materials over time are defined as:

$$T_i = cI^d$$

where c and d are constants and I is the current density through the subpixels.

16. The method claimed in claim 13, wherein the differently colored subpixels emit red, green and blue light.

17. The method claimed in claim 13, wherein more than three colored subpixels are used to form the color display device.

18. The method claimed in claim 16, wherein the area of the blue subpixel is substantially larger than the area of the red and green subpixels to compensate for the relatively short lifetime of the blue subpixels.

19. The method claimed in claim 13, wherein the subpixels are stacked on top of one another.

20. The method claimed in claim 19, wherein layers of light emitting material of the same color are stacked on top of one another to form a subpixel.

21. The method claimed in claim 20, wherein different numbers of layers of different colored light emissive materials are stacked on top of one another to provide the different sized subpixels.

22. The method claimed in claim 19, wherein the subpixels having the largest size are located on one plane, and subpixels having a plurality of different sizes are located on another plane.

23. The method claimed in claim 22, wherein the subpixels are red, green and blue, the blue emissive elements are located in the one plane and the red and green subpixels are located in the other plane.

24. The method claimed in claim 13, wherein at least one of the subpixels is subdivided into visually distinct regions.

25. A method of determining the relative sizes of subpixels in an OLED display device of the type having a display pixel that includes a plurality of subpixels of different colors, wherein sizes of the subpixels are different based on the emission efficiency of the subpixels, the chromaticity of a target display white, and the relative luminance stability over time of the subpixels, thereby protecting the subpixels whose emission efficiency is low from prematurely deteriorating, comprising the steps of:

a) providing chromaticity coordinates for the subpixels;
b) selecting aim chromaticity coordinates and luminance of a target display white point;
c) calculating a required luminance for each subpixel using the chromaticity coordinates of the subpixels, and the aim chromaticity coordinates and the luminance of the target display white point;
d) determining a functional relationship between current and luminance output for each subpixel;
e) calculating a required current for each subpixel to produce the required luminance using the functional relationships between current and luminance;
f) determining a functional relationship between current density and a luminance stability over time for each subpixel;
g) selecting a target useful lifetime;
h) calculating a current density that will obtain the selected useful lifetime for each subpixel using the relationships between current density and luminance stability over time; and
i) calculating a size for each subpixel by dividing the required currents by the respective calculated current densities.

26. The method claimed in claim 25, wherein the relative sizes are determined according to the equation:

$$A_i = f(E_i, T_i, Y_i)$$

where $A_i$ are the areas of the subpixels; $E_i$ are the material efficiencies for the differently colored subpixels; $T_i$ are the luminance stability over time for the differently colored subpixels; and $Y_i$ are the luminances of the differently colored subpixels for a given target display white and the chromaticity coordinates of the subpixels.

27. The method claimed in claim 26, wherein the luminance stability over time are defined as:

$$Ti = cI^d$$

where c and d are constants and I is the current density through the subpixels.

28. The method claimed in claim 25, wherein the differently colored subpixels emit red, green and blue light.

29. The method claimed in claim 25, wherein more than three colored subpixels are used to form the color display device.

30. The method claimed in claim 28, wherein the area of the blue subpixel is substantially larger than the area of the red and green subpixels to compensate for the relatively short lifetime of blue subpixels.

31. The method claimed in claim 25, wherein the subpixels are stacked on top of one another.

32. The method claimed in claim 31, wherein layers of the same color light emitting materials are stacked on top of one another to form a subpixel.

33. The method claimed in claim 32, wherein different numbers of different colored light emitting materials are stacked on top of one another to provide the different sized subpixels.

34. The method claimed in claim 31, wherein the subpixels having the largest size are located on one plane, and subpixels having a plurality of different sizes are located on another plane.

35. The method claimed in claim 34, wherein the subpixels emit red, green and blue light, the blue subpixels are located in the one plane and the red and green subpixels are located in another plane.

36. The method claimed in claim 25, wherein at least one of the subpixels is subdivided into visually distinct regions.

* * * * *